(12) United States Patent
Kawaguchi et al.

(10) Patent No.: US 7,276,711 B2
(45) Date of Patent: Oct. 2, 2007

(54) BEAM SPACE-CHARGE COMPENSATION DEVICE AND ION IMPLANTATION SYSTEM HAVING THE SAME

(75) Inventors: Hiroshi Kawaguchi, Ehime (JP); Takanori Yagita, Ehime (JP); Takashi Nishi, Ehime (JP); Junichi Murakami, Ehime (JP); Mitsukuni Tsukihara, Ehime (JP); Mitsuaki Kabasawa, Ehime (JP)

(73) Assignee: SEN Corporation, an SHI and Axcelis Company, Tokyo (JP)

( * ) Notice: Subject to any disclaimer, the term of this patent is extended or adjusted under 35 U.S.C. 154(b) by 283 days.

(21) Appl. No.: 11/150,273

(22) Filed: Jun. 13, 2005

(65) Prior Publication Data

US 2006/0113491 A1 Jun. 1, 2006

(30) Foreign Application Priority Data

Nov. 30, 2004 (JP) .............................. 2004-345163

(51) Int. Cl.
*H01J 37/317* (2006.01)
(52) U.S. Cl. .................................. 250/492.21; 250/251
(58) Field of Classification Search ........... 250/492.21, 250/251
See application file for complete search history.

(56) References Cited

U.S. PATENT DOCUMENTS

| | | | |
|---|---|---|---|
| 5,668,368 A * | 9/1997 | Sakai et al. | 250/251 |
| 6,313,428 B1 * | 11/2001 | Chen et al. | 219/121.43 |
| 6,753,539 B2 * | 6/2004 | Kawaguchi | 250/492.21 |

* cited by examiner

*Primary Examiner*—Kiet T. Nguyen
(74) *Attorney, Agent, or Firm*—Arent Fox LLP

(57) ABSTRACT

A beam space-charge compensation device is applied to an angular energy filter provided in an ion beam processing system that performs processing by irradiating onto a wafer with an ion beam. The beam space-charge compensation device comprises a plasma shower provided in a beam-guiding chamber of the angular energy filter. The plasma shower comprises an arc chamber having a filament for generating thermo-electrons for plasma. The arc chamber comprises an extraction hole for extracting the thermo-electrons. The plasma shower is arranged such that the extraction hole is located on lines of magnetic force, perpendicular to an ion beam advancing direction, of the magnetic field and that a center axis of the filament and a center axis of said extraction hole coincide with the lines of magnetic force, perpendicular to the ion beam advancing direction, of the magnetic field.

12 Claims, 11 Drawing Sheets

BEAM SPACE-CHARGE COMPENSATION DEVICE AND ION IMPLANTATION SYSTEM HAVING THE SAME

This application claims priority to prior application JP 2004-345163, the disclosure of which is incorporated herein by reference,

BACKGROUND OF THE INVENTION

This invention relates to an ion implantation system having an angular energy filter that deflects an ion beam by the use of at least one of an electric field and a magnetic field and further relates to a beam space-charge compensation device suitable for application thereto.

An ion implantation system is widely used in the process of manufacturing semiconductor integrated circuits because of its capability of introducing impurities into fine regions of a surface of a processing object with high accuracy. In the ion implantation system, since ions having charges are implanted into a wafer as a processing object, the storage of charge (charge-up) onto the wafer becomes a problem. In addition, there also arises a problem of divergence of an ion beam due to space charge produced in a beam line.

Since the ions that are implanted normally have positive charges, negative charges (electrons) are supplied for defusing the charge-up and suppressing the ion beam divergence. As an example thereof, there is a method of positively supplying electrons produced by collision of the ions with walls of the beam line. Alternatively, there is a method of producing secondary electrons by the use of an electron gun near the wafer and supplying them. Among various methods like these, use is widely made of a plasma shower (or plasma flood gun) as a method that can supply relatively low-energy electrons.

In a batch ion implantation system, wafers are mounted on a rotary disk capable of a linear reciprocating motion to thereby enable ion implantation over the whole surface of each wafer. In this case, a trajectory of an ion beam is fixed with respect to a beam line. A plasma shower is provided near the trajectory of the ion beam so that electrons are extracted from the plasma shower by the potential of the ion beam.

FIG. 1 is an exemplary diagram of a conventional plasma shower used in a batch ion implantation system for defusing the charge-up.

In FIG. 1, a plasma forming gas 216 is introduced into an arc chamber 215. Plasma is formed by heating a filament 217 using the power from a power supply 218 while applying an arc voltage 219 across the arc chamber 215 and the filament 217. By configuring that an ion beam 228 is located near the arc chamber 215, electrons are extracted due to the potential generated by the ion beam 228 so that the charge-up caused by the ion beam 228 is suppressed. It is assumed that the ion beam 228 is advancing from the front side toward the back side of the sheet of FIG. 1. Feeding of electrons from the arc chamber 215 to the ion beam 228 can be facilitated by disposing a shower tube 237 so as to surround the ion beam 228 and applying a potential 238 to the shower tube 237.

On the other hand, in an ion implantation system having a deflection mechanism for scanning that carries out beam deflecting for scanning by providing a linear reciprocating motion of an ion beam itself, the relative position between the ion beam and a plasma shower constantly changes and therefore a stable supply of electrons is difficult in view of this, there are proposed various methods for supplying electrons extracted from a plasma shower to an ion beam that is deflected for scanning.

As an example, there is proposed a method of applying a magnetic field over a deflecting area of an ion beam, of which the trajectory changes in a wide range, in order to facilitate feeding of electrons to the ion beam in an ion beam charge compensation device (e.g. JP-A-H09-147785). In this method, a plasma arc chamber is disposed at the center of the beam deflecting area so as to be perpendicular to the beam and the magnetic field spreading from the center of the plasma arc chamber over the whole beam deflecting area is generated by a coil.

However, in the method of spreading the electrons extracted from the single portion over the deflecting area of the ion beam by the use of the magnetic field, since a leakage magnetic field exists in a beam line, the ion beam is bent so that distribution and implantation angle of the ion beam are adversely affected.

The following methods are employed in the conventional plasma shower.

(a) Since electrons move so as to wind around lines of magnetic force, when there is a magnetic field around the plasma shower that precludes extraction of electrons or feeding of electrons to an ion beam, a magnetic shield is provided to thereby reduce the magnetic field.

(b) By providing a magnetic field generating portion, a magnetic field is generated which serves to increase the efficiency of plasma production in the arc chamber or the efficiency of electron extraction from the arc chamber.

(c) A magnetic field generating portion is further provided in the beam line to thereby generate a magnetic field that efficiently confines the electrons extracted into the beam line.

In addition, in the ion implantation system, a deflection portion called an angular energy filter (hereinafter abbreviated as an "AEF") is normally provided on the downstream side of the foregoing deflection mechanism for scanning. As will be described later, the AEF has an AEF chamber. In the AEF chamber, an electric field or a magnetic field (hereinafter referred to as an "AEF magnetic field"), which is strong, is generated for bending the ion beam.

Assuming that the plasma shower is arranged in the AEF chamber for producing plasma in the presence of the AEF magnetic field, it is necessary to provide a mechanism for canceling the AEF magnetic field like in the foregoing method (a) or a mechanism for generating a magnetic field effective for the plasma shower like in the foregoing method (b) or (c). In any event, however, it is not desirable to provide the new mechanism in terms of concern about complexity of the ion implantation system, disturbance of the AEF magnetic field, or the like.

SUMMARY OF THE INVENTION

It is an object of this invention to positively utilize an AEF magnetic field for improvement in production of plasma by a plasma shower, extraction of electrons, and confinement of electrons to thereby efficiently perform beam space-charge compensation without using a particular magnetic field generating device or a particular magnetic field shielding device.

It is a specific object of this invention to provide a beam space-charge compensation device that can neutralize beam space-charge to suppress divergence of an ion beam, thereby improving the beam transportation compensation efficiency to increase a beam current.

It is another object of this invention to provide an ion implantation system having the foregoing beam space-charge compensation device.

A beam space-charge compensation device according to this invention is applied to an angular energy filter provided midway in a beam path in an ion beam processing system that performs processing by irradiating onto a wafer with an ion beam. The angular energy filter selects only an ion species having a necessary energy from the ion beam by the use of at least a magnetic field out of an electric field and the magnetic field. According to an aspect of this invention, the beam space-charge compensation device comprises a plasma shower provided in a chamber of the angular energy filter for beam space-charge compensation. The plasma shower comprises an arc chamber having therein a filament for generating thermo-electrons for plasma. The arc chamber comprises an extraction hole for extracting the thermo-electrons in the generated plasma. The plasma shower is arranged such that the extraction hole is located on lines of magnetic force, perpendicular to an ion beam advancing direction, of the magnetic field and that a center axis of the filament and a center axis of the extraction hole coincide with the lines of magnetic force, perpendicular to the ion beam advancing direction, of the magnetic field.

In the beam space-charge compensation device, it is preferable that the plasma shower is provided on both inner-sides of a beam-guiding chamber of the angular energy filter with the ion beam interposed between the both inner-sides.

In the beam space-charge compensation device, it is preferable that the beam-guiding chamber of the angular energy filter also serves as a plasma shower chamber.

In the beam space-charge compensation device, it is preferable that, in order to form plasma confinement magnetic fields at upper, lower, left, and right inner walls, with respect to the ion beam, of the beam-guiding chamber of the angular energy filter, a plurality of magnets are disposed at each of the upper, lower, left, and right inner walls.

In the beam space-charge compensation device, it is preferable that the confinement magnetic fields at the left and right inner walls in the beam-guiding chamber of the angular energy filter are formed by disposing the plurality of magnets along the ion beam deflected by the angular energy filter.

In the beam space-charge compensation device, it is preferable that the confinement magnetic fields at the upper and lower inner walls in the beam-guiding chamber of the angular energy filter are formed by disposing the plurality of magnets at the upper and lower inner walls at intervals defined in the ion beam advancing direction. Each of the plurality of magnets at the upper and lower inner walls extends in a leftward/rightward direction.

In the beam space-charge compensation device, it is preferable that the plasma shower is provided at a position corresponding to the vicinity of a deflection point of the ion beam caused by the angular energy filter.

In the beam space-charge compensation device, it is preferable that plasma is produced in the beam-guiding chamber of the angular energy filter where the magnetic field exists.

In the beam space-charge compensation device, it is preferable that the angular energy filter selects only the ion species having the necessary energy from the ion beam by the use of the magnetic field and the electric field and comprises, for producing the electric field, a pair of deflection electrodes arranged on upper and lower sides with respect to the ion beam and suppression electrodes and ground electrodes arranged on upstream and downstream sides with respect to the ion beam advancing direction. The plasma shower is disposed at a position defined between the pair of deflection electrodes and between the suppression and ground electrodes on the upstream side and the suppression and ground electrodes on the downstream side. An arc voltage is applied across the arc chamber, and the pair of deflection electrodes and the ground electrodes while the angular energy filter is operated by the magnetic field.

In the beam space-charge compensation device, it is preferable that a plasma production region is formed by partitioning the inside of the beam-guiding chamber of the angular energy filter by the use of the ground electrodes arranged on the upstream and downstream sides of the plasma shower and each having a required minimum opening.

In the beam space-charge compensation device, it is preferable that the plasma shower, the pair of deflection electrodes, the suppression and ground electrodes on the upstream side, and the suppression and ground electrodes on the downstream side are configured so as to be integrally attachable and detachable with respect to the beam-guiding chamber of said angular energy filter.

According this invention, an ion implantation system comprising the beam space-charge compensation device mentioned above is provided.

DESCRIPTION OF THE PREFERRED EMBODIMENTS

Figure 1:
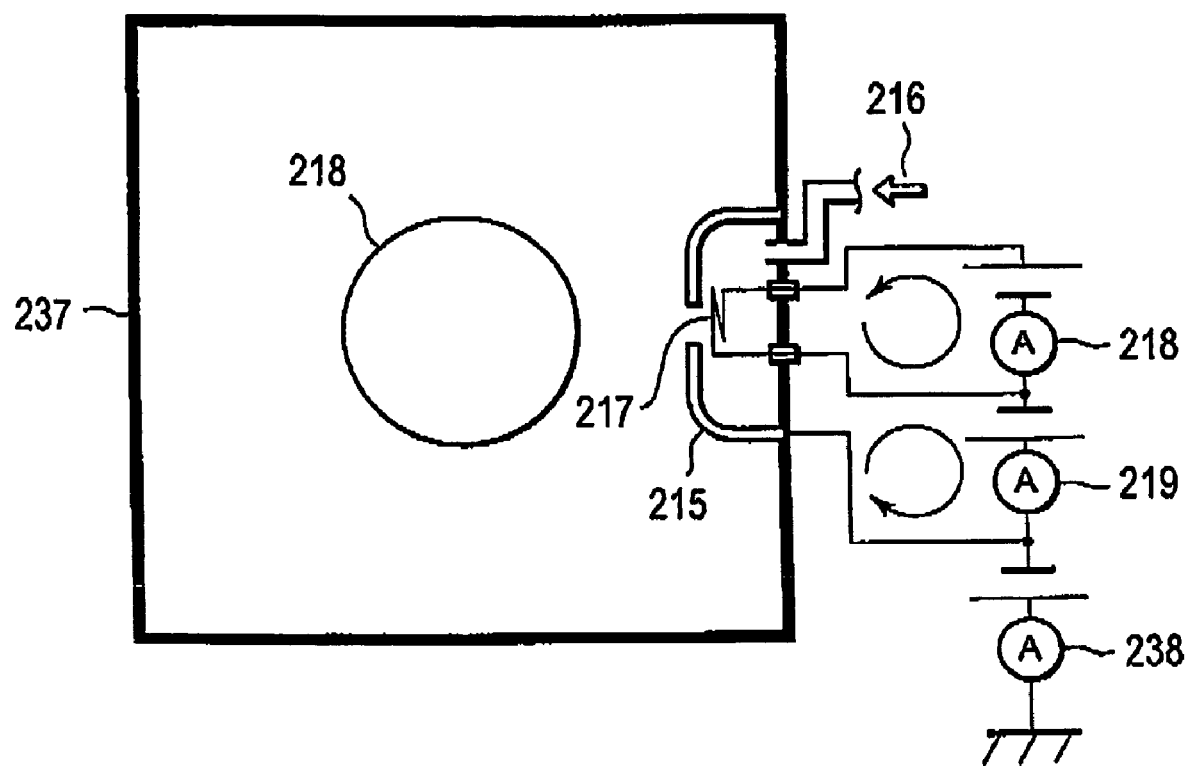
FIG. 1 is an exemplary diagram of a conventional plasma shower used in a batch ion implantation system.
Figure 2A:
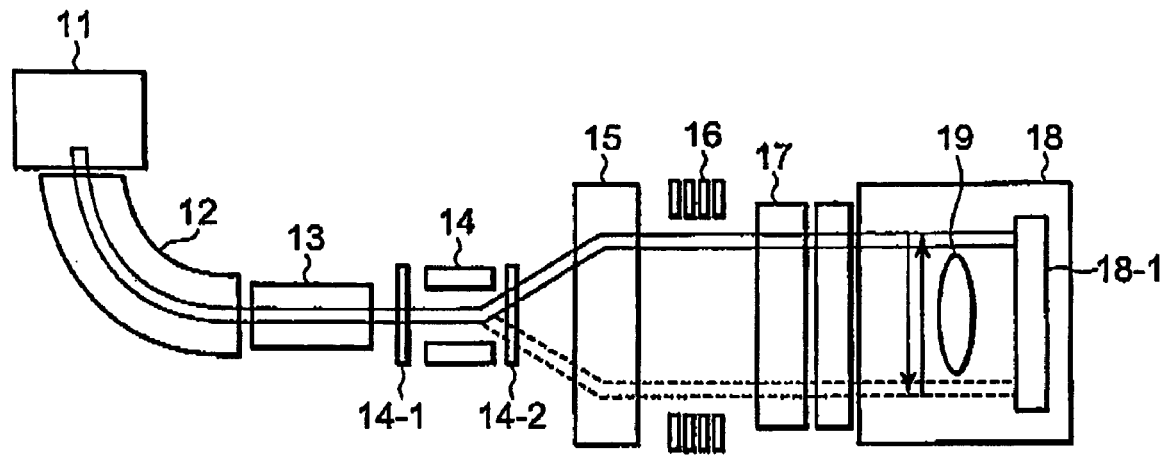
FIGS. 2A and 2B are a plan view and a side view, respectively, showing a schematic structure of an ion implantation system applied with this invention.
Figure 2B:
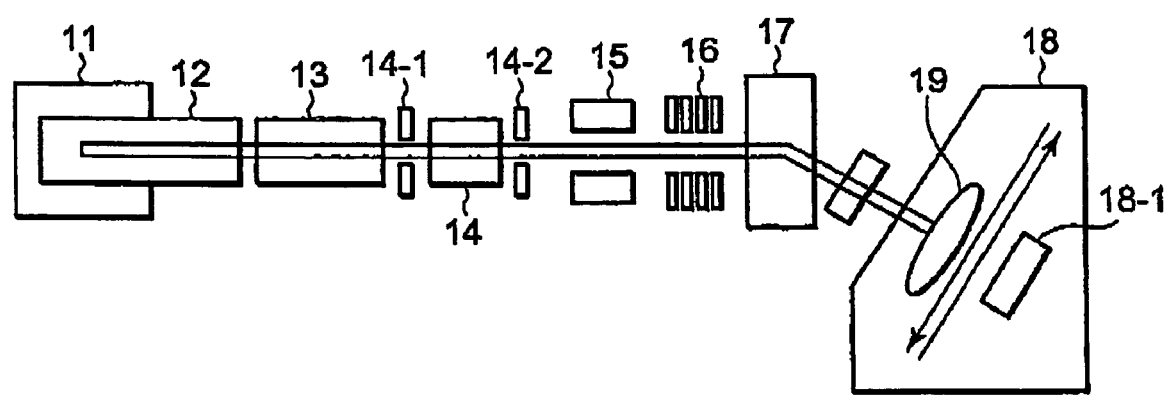

Referring to FIGS. 2A and 2B, description will be first given about an example wherein a beam space-charge compensation device according to this invention is employed. In this example, this invention is applied particularly to a single-wafer ion implantation system among beam processing systems each using a charged particle beam. FIGS. 2A and 2B are a plan view and a side view, respectively, showing a schematic structure of the single-wafer ion implantation system.

The illustrated ion implantation system comprises an ion source 11, a mass analysis magnet device 12, a beam shaper 13, a deflector 14 for scanning, a P (Parallelizing)-lens 15, acceleration/deceleration electrodes (A/D columns) 16, an angular energy filter (AEF) 17, and a process chamber 18.

In this ion implantation system, ions generated in the ion source 11 are extracted through an extraction electrode (not illustrated) as an ion beam (hereinafter referred to as a "beam"). The extracted beam is subjected to a mass analysis in the mass analysis magnet device 12 so that only a necessary ion species is selected. The beam composed of only the necessary ion species is shaped in cross-section by the beam shaper 13. The beam shaper 13 is formed by a Q (Quadrant or Quadrupole)-lens and so on. The beam having the shaped cross-section is deflected in an upward/downward direction in FIG. 2A by the deflector 14. The deflector 14 has at least one shield electrode 14-1 and at least one shield electrode 14-2 that are disposed near the deflection scanner 14 on its upstream and downstream sides, respectively. Although deflection scan electrodes are used as the deflector 14 in this embodiment, a deflection scan magnet may be used in place of them.

The beam deflected by the deflector 14 for scanning is re-parallelized by the P-lens 15 formed by electrodes or a magnet so as to be parallel to an axis of a deflection angle of 0°. In FIG. 2A, a scan range of the beam by the deflector 14 is indicated by a thick black line and double broken lines. The beam from the P-lens 15 is accelerated or decelerated by one or more acceleration/deceleration electrodes 16 and sent to the angular energy filter 17. The angular energy filter 17 performs an analysis about energy of the beam to thereby select only an ion species having a necessary energy. As shown in FIG. 2B, only the selected ion species is deflected slightly downward in the angular energy filter 17. The beam composed of only the thus selected ion species is implanted into a wafer 19 being a to-be-irradiated object introduced in the process chamber 18. The beam that is not implanted into the wafer 19 is incident on a beam stopper 18-1 provided in the process chamber 18 so that energy thereof is consumed.

In FIG. 2A, arrows shown adjacent to the wafer 19 represent that the beam is deflected in directions of these arrows, while, in FIG. 2B, arrows shown adjacent to the wafer 19 represent that the wafer 19 is moved in directions of these arrows. Specifically, assuming that the beam is reciprocatingly deflected in, for example, x-axis directions, the wafer 19 is driven by a drive mechanism (not illustrated) so as to be reciprocated in y-axis directions perpendicular to the x-axis directions. This enables irradiation with the beam over the whole surface of the wafer 19.

In the manner as described above, in the ion implantation system shown in FIGS. 2A and 2B, a beam having an elliptical or oval continuous cross-section that is long in one direction can be obtained by deflecting a beam having a circular cross-section or an elliptical or oval cross-section and then bent at a uniform angle at any positions in a scan area thereof by the use of the angular energy filter serving as a later-stage energy analyzer and can be implanted into the wafer 19.

Referring now to FIGS. 3 to 7, description will be given in detail about the angular energy filter 17 applied with this invention.

Figure 3:
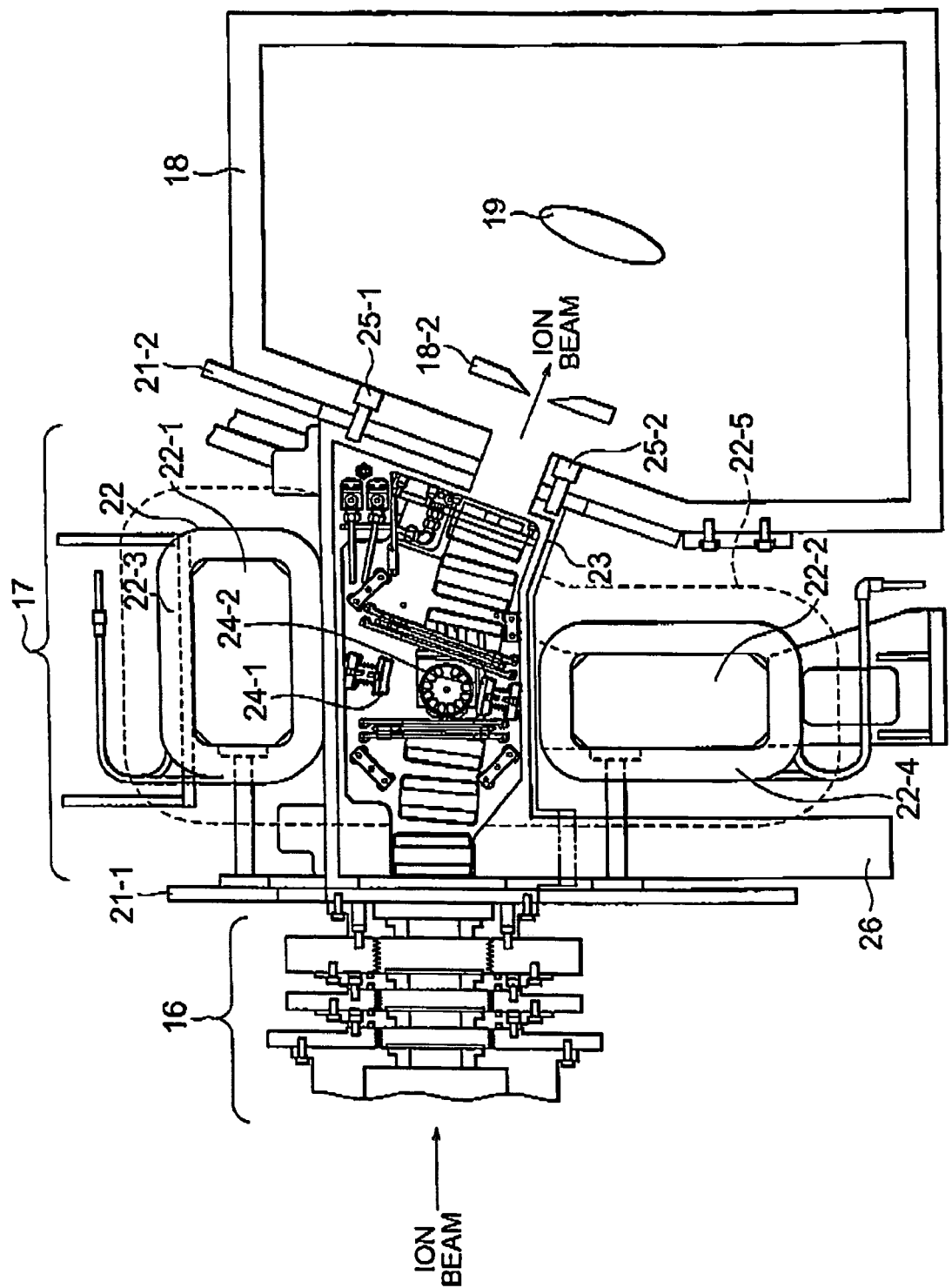
FIG. 3 is a vertical sectional view showing a structure of an angular energy filter and its peripheral structures in the ion implantation system applied with this invention.

As shown in FIG. 3, the angular energy filter 17 comprises a pair of magnetic shields 21-1 and 21-2, a deflection magnet (analyzing electromagnet) 22 disposed between the magnetic shields 21-1 and 21-2, an AEF chamber (also called a vacuum chamber or a beam-guiding chamber) 23 disposed in a hollow portion of the deflection magnet 22, and a pair of deflection electrodes 24-1 and 24-2 disposed in the AEF chamber 23.

The magnetic shields 21-1 and 21-2 each have an opening (e.g. a rectangular opening long in a direction perpendicular to the sheet surface of FIG. 3) at its center portion for passing the beam therethrough and are respectively fixed to the acceleration/deceleration electrodes 16 and the process chamber 18. The magnetic shields 21-1 and 21-2 serve to shield a magnetic field generated by the deflection magnet 22 to thereby adjust an influence of the magnetic field exerted on the beam.

As will be described later, the deflection magnet 22 comprises a generally quadrangular (frame-shaped) core, and one or more coils 22-3 and one or more coils 22-4 respectively wound on an upper yoke 22-1 and a lower yoke 22-2 each forming part of the core. Further, as shown by a broken line in FIG. 3, correction coils (only one shown) 22-5 for leakage magnetic field cancellation may be wound on the core outside the coils 22-3 and 22-4 (on the front and back sides of the sheet of FIG. 3) so as to cover both sides of the upper and lower yokes 22-1 and 22-2. The correction coils 22-5 for leakage magnetic field cancellation are used for canceling unwanted portions (leakage magnetic fields) of magnetic fields generated by the coils 22-3 and 22-4.

The deflection magnet 22, in operation, generates a magnetic field at its hollow portion in the direction perpendicular to the sheet surface of FIG. 3 (e.g. directed toward the back of the sheet of FIG. 3) so that the beam advancing from left to right in the figure is deflected slightly downward. As a result, the beam passes through an energy slit 18-2 provided in the process chamber 18 disposed on the downstream side (on the right side in FIG. 3) of the deflection magnet 22 and is implanted into the wafer 19 introduced and retained in the process chamber 18. Note that the beam has an elliptical or oval continuous cross-section that is long in the direction perpendicular to the sheet surface of FIG. 3.

The AEF chamber 23 provided in the hollow portion of the deflection magnet 22 is fixed at its downstream side, along with the magnetic shield 21-2, to the process chamber 18 by the use of support bolts 25-1 and 25-2. The upstream side (the left side in FIG. 3) of the AEF chamber 23 is auxiliarily supported by a support rod 26 from the lower side. In this manner, by employing the support and fixing structure in which the AEF chamber 23 is fixed to the process chamber 18 while supported by the support rod 26 depending on necessity, the AEF chamber 23 can be securely fixed in position although surrounded by the core and coils of the deflection magnet 22 and further by other components.

Figure 4:
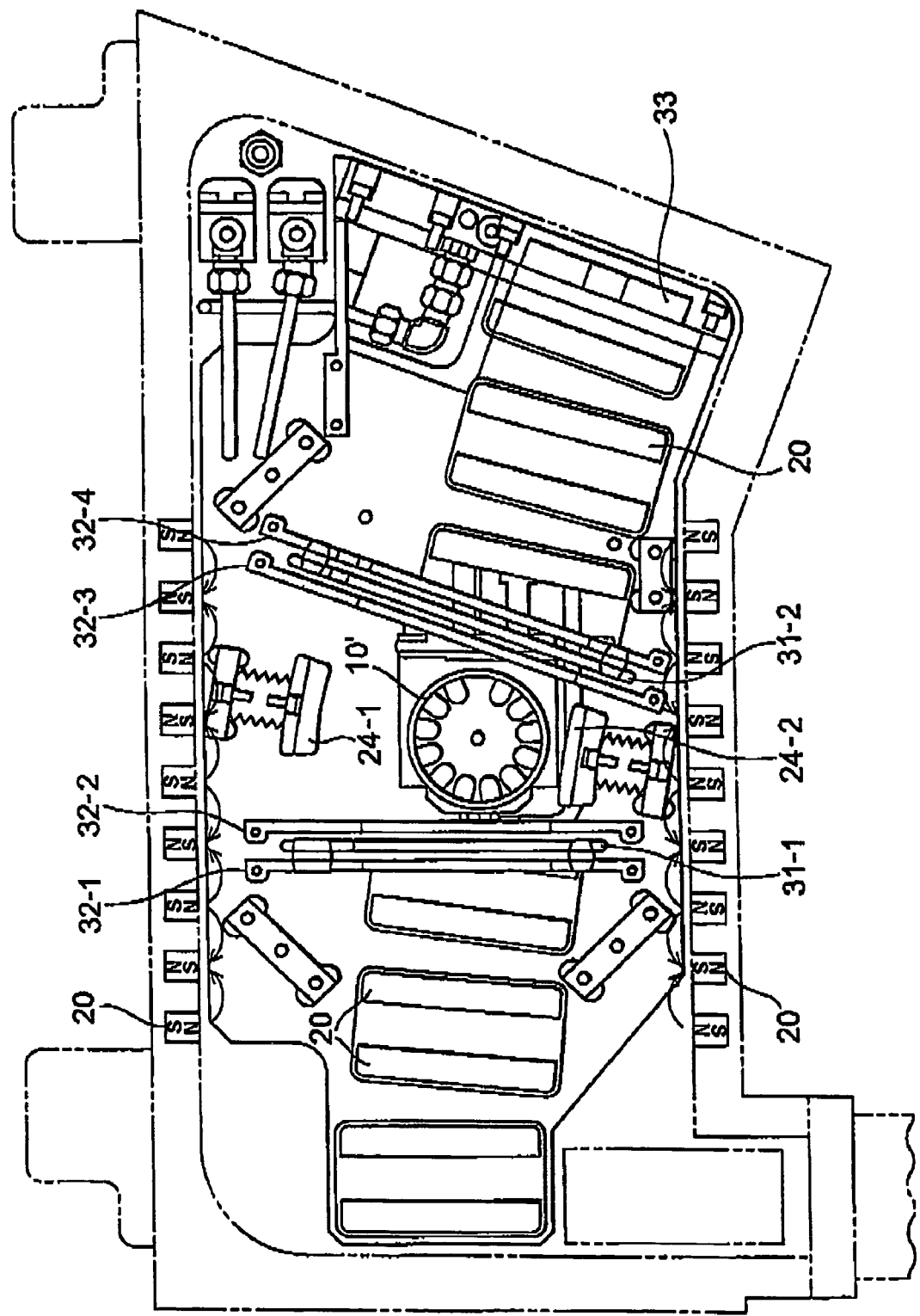
FIG. 4 is a vertical sectional view showing, on an enlarged scale, an internal structure of the angular energy filter shown in FIG. 3.
Figure 5:
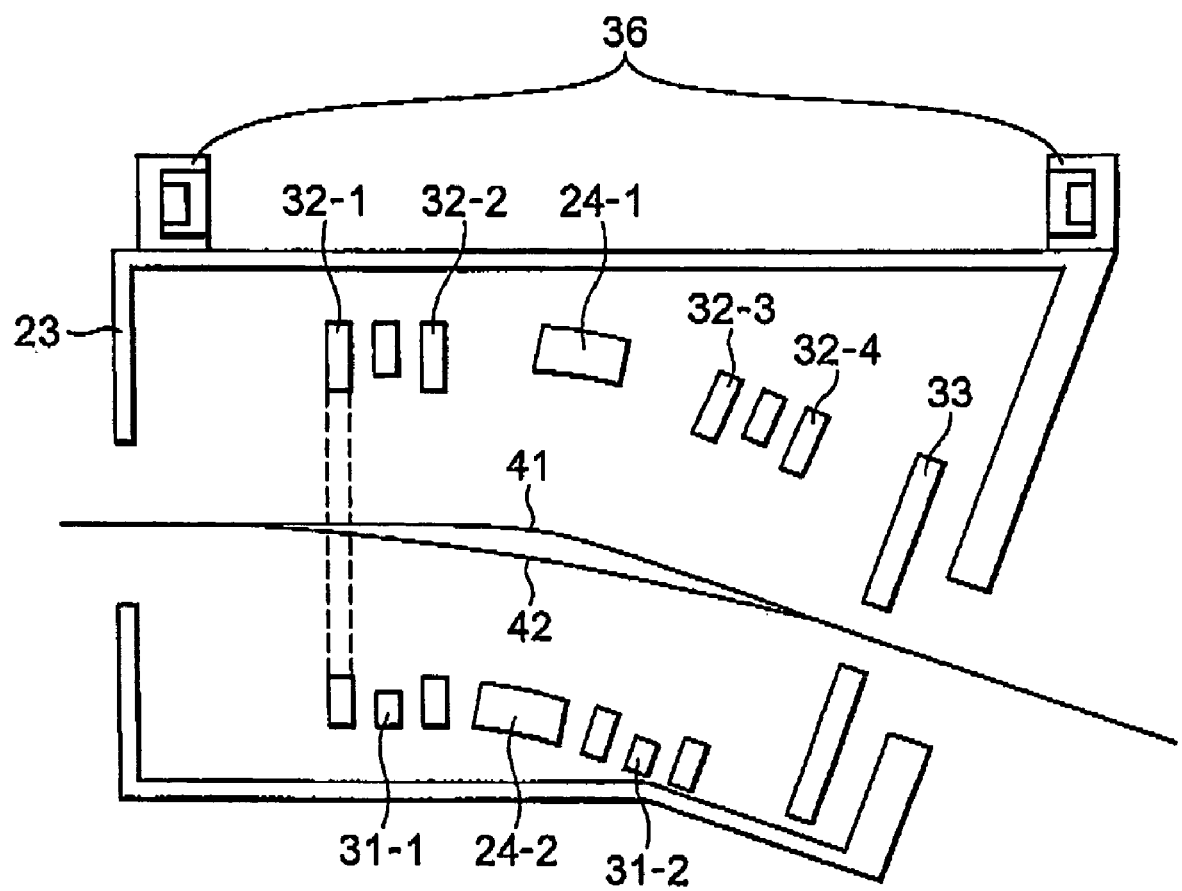
FIG. 5 is a diagram exemplarily showing a structure of the angular energy filter shown in FIG. 3 for explaining operation thereof.
Figure 6:
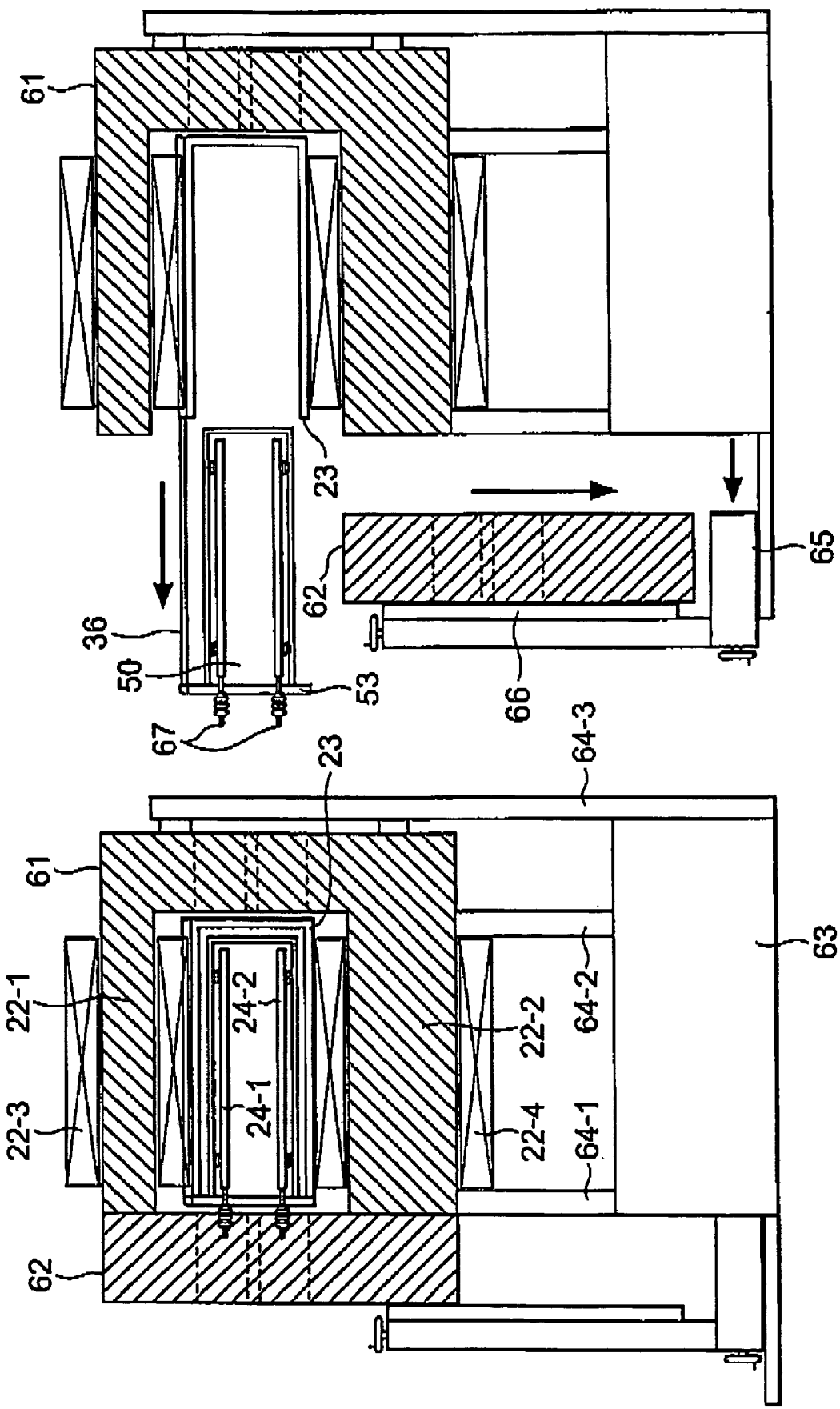
FIGS. 6A and 6B are diagrams for explaining a structure in which internal components of the angular energy filter shown in FIG. 3 are integrated together so as to be attachable and detachable with respect to a chamber of the angular energy filter.

In the AEF chamber 23, as shown in FIG. 4 on an enlarged scale, there are provided, in addition to the foregoing deflection electrodes 24-1 and 24-2, suppression electrodes 31-1 and 31-2 respectively located on the upstream and downstream sides of the deflection electrodes 24-1 and 24-2, ground electrodes 32-1 and 32-2 respectively located on the upstream and downstream sides of the suppression electrode 31-1, ground electrodes 32-3 and 32-4 respectively located on the upstream and downstream sides of the suppression electrode 31-2, and a beam dump 33 located on the most downstream side.

The deflection electrodes 24-1 and 24-2, the suppression electrodes 31-1 and 31-2, and the ground electrodes 32-1 to 32-4 are disposed and supplied with the power so that deflection points (trajectory) obtained when the beam is deflected by an electric field produced by the use of these electrodes substantially coincide with or overlap deflection points (trajectory) obtained when the beam is deflected by the use of the deflection magnet 22. Specifically, as exemplarily shown in FIG. 5, these electrodes are arranged so that a trajectory 41 of the beam deflected by the produced electric field overlaps a trajectory 42 of the beam deflected by the magnetic field generated by the use of the deflection magnet 22 at least on an incident and an outgoing side of the AEF chamber 23, i.e. the angular energy filter 17. By providing the suppression electrodes 31-1 and 31-2 and the ground electrodes 32-1 to 32-4, it becomes possible to apply a higher voltage across the deflection electrodes 24-1 and 24-2 and, therefore, even when the energy of the beam is larger, a desired trajectory can be realized. Further, the cross-sectional shape of each of the deflection electrodes 24-1 and 24-2 is curved (the deflection electrode 24-1 has a concave shape while the deflection electrode 24-2 has a convex shape) so as to match a radius of curvature of the beam and thus the beam can be deflected efficiently.

The beam dump 33 has an opening for passing therethrough the beam deflected by the magnetic field or the electric field and allows ions each having a required energy and a charge number to pass therethrough. On the other hand, the beam dump 33 receives thereon a neutralized beam or a beam whose energy or charge number differs from a predetermined value.

The components in the AEF chamber 23 including the deflection electrodes 24-1 and 24-2, the suppression electrodes 31-1 and 31-2, the ground electrodes 32-1 to 32-4, and the beam dump 33 are formed as a single unit (AEF unit) together with a plasma shower which will be described later. Specifically, the plasma shower, the electrodes 24-1, 24-2, 31-1, 31-2, and 32-1 to 32-4 and the beam dump 33 are, along with other components, fixed to a common plate or the like and integrated together.

Figure 7:
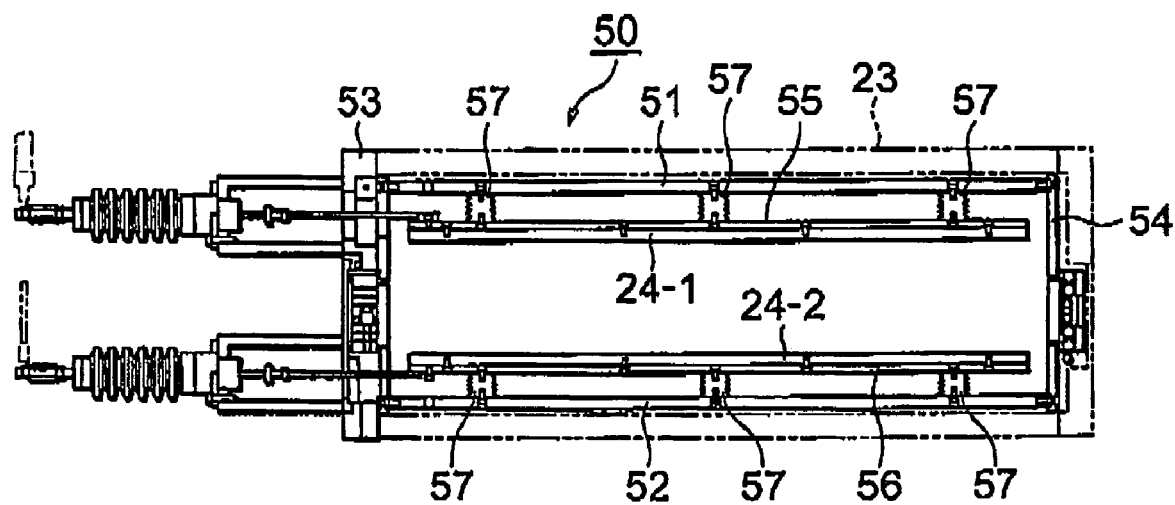
FIG. 7 is a diagram for explaining a unit structure, shown in FIGS. 6A and 6B, that allows the internal components of the angular energy filter to be attachable and detachable with respect to a beam-guiding chamber thereof.

One example of the AEF unit is shown in FIG. 7. FIG. 7 is a cross-sectional view taken along a plane including centerlines of the respective deflection electrodes 24-1 and 24-2 and is a diagram, as seen from the beam outgoing side, of an AEF unit 50.

As shown in FIG. 7, the AEF unit 50 comprises an upper support 51, a lower support 52, a front plate 53 serving as part (a cover) of the AEF chamber 23, and a rear plate 54. The deflection electrodes 24-1 and 24-2 are respectively mounted to insulating mount plates 55 and 56 and fixed to the upper and lower supports 51 and 52 through a plurality of insulators 57.

The plasma shower and the other components in the AEF chamber 23, including the suppression electrodes and so on, are also respectively fixed to the upper support 51, the lower support 52, the front plate 53, and the rear plate 54 directly or through auxiliary supports 58-1 and 58-2 and so on and thus integrated together.

Further, as shown in FIG. 6B, front ends of a pair of slide rails 36 placed on the outer top surface of the AEF chamber 23 are fixed to the front plate 53 at its upper edge portion. With this arrangement, the AEF unit 50 is supported so as to be movable in and out with respect to the AEF chamber 23. For positioning the AEF unit 50 at a predetermined location when the AEF unit 50 is inserted into the AEF chamber 23, the rear plate 54 may be provided with a positioning portion (e.g. a projection).

Now, the deflection magnet 22 will be described. Referring to FIGS. 6A and 6B, the deflection magnet 22 comprises a generally ⊐-shaped first core 61 and a generally I-shaped second core 62. The generally quadrangular (frame-shaped) core formed with the hollow portion at its center is constituted by fixing the first and second cores 61 and 62 in the state where they butt each other. Portions of the first core 61 form the upper yoke 22-1 and the lower yoke 22-2, respectively, and the coils 22-3 and 22-4 are wound around them, respectively, to form an electromagnet.

As understood from FIG. 3, the upper yoke 22-1 has a shape that is long in the beam advancing direction (leftward/rightward direction in FIG. 3), while the lower yoke 22-2 has a shape that is long in a direction (upward/downward direction in FIG. 3) perpendicular to the beam advancing direction. Each side of the core has a generally fan shape with no facial angle that is wide on the side of the upper yoke 22-1 while narrow on the side of the lower yoke 22-2. It is preferable that the cross-sectional area of the upper yoke 22-1 and that of the lower yoke 22-2 be equal to each other in terms of facilitation of designing the magnetic field.

Referring again to FIGS. 6A and 6B, the first core 61 is fixed to a base 63 through a plurality of support columns 64-1 to 64-3. A first linear guide 65 is movable in the horizontal direction and a second linear guide 66 is mounted on the first linear guide 65 and movable in the vertical direction. The second core 62 is attached to the second linear guide 66 provided on the first linear guide 65. By operating the first and second linear guides 65 and 66, the second core 62 is moved (slid) in the horizontal and vertical directions with respect to the first core 61 so that it is possible to achieve a change from the state shown in FIG. 6A to the state shown in FIG. 6B or, conversely, from the state shown in FIG. 6B to the state shown in FIG. 6A.

On the other hand, the plasma shower, the deflection electrodes 24-1 and 24-2, the other electrodes, and so on are, as described above, integrated together to form the AEF unit 50. The AEF unit 50 is supported so as to be pushable into and drawable from the AEF chamber 23 by the use of the slide rails 36.

When the second core 62 is separated from the first core 61 by operating the linear guides 65 and 66 in the state shown in FIG. 6A, the front plate 53 is exposed to the exterior. If the AEF unit 50 is pulled out in that state, it is possible to achieve the state shown in FIG. 6B, i.e. the state where the deflection electrodes 24-1 and 24-2 and so on are located and exposed outside the AEF chamber 23. In this manner, in this embodiment, since the deflection electrodes 24-1 and 24-2 and so on can be easily taken out from the AEF chamber 23 and exposed to the outside, the maintenance and replacement thereof can be facilitated.

After carrying out the maintenance and replacement of the components, the AEF unit 50 is pushed into the AEF chamber 23 and the front plate 53 is sealingly fixed to the AEF chamber 23 so that the deflection electrodes 24-1 and 24-2 and so on can be placed at a predetermined position within the AEF chamber 23.

With respect to the angular energy filter 17 configured as described above, a controller (not illustrated) in the ion implantation system selectively feeds the power to either the deflection magnet 22 or the deflection electrodes 24-1 and 24-2 depending on a property of the ion beam implanted into the wafer. That is, the controller of the ion implantation system serves as a magnetic field/electric field switching device of the angular energy filter 17. Note that when feeding the power to the deflection electrodes 24-1 and 24-2, the controller of the ion implantation system simultaneously feeds the power to the suppression electrodes 31-1 and 31-2.

It differs depending on an ion species (ion source) or the like whether the controller of the ion implantation system feeds the power to the deflection magnet 22 or the deflection electrodes 24-1 and 24-2. However, it may be considered that the power is fed to the deflection magnet 22 when the energy of the beam is lower than a certain threshold value in the range of approximately ten to several tens of keV while the power is fed to the deflection electrodes 24-1 and 24-2 (and the suppression electrodes 31-1 and 31-2) when it is higher than the threshold value.

As described above, in the ion implantation system, it is possible to select whether to use a magnetic field or an electric field as a deflection method of a beam in the angular energy filter 17, depending on the beam condition (property). Further, even when either the magnetic field or the electric field is selected as the deflection method of the beam in the angular energy filter 17, the trajectory of the beam does not change. Therefore, no particular trajectory correction means is required and thus the structure is simple.

Figure 8:
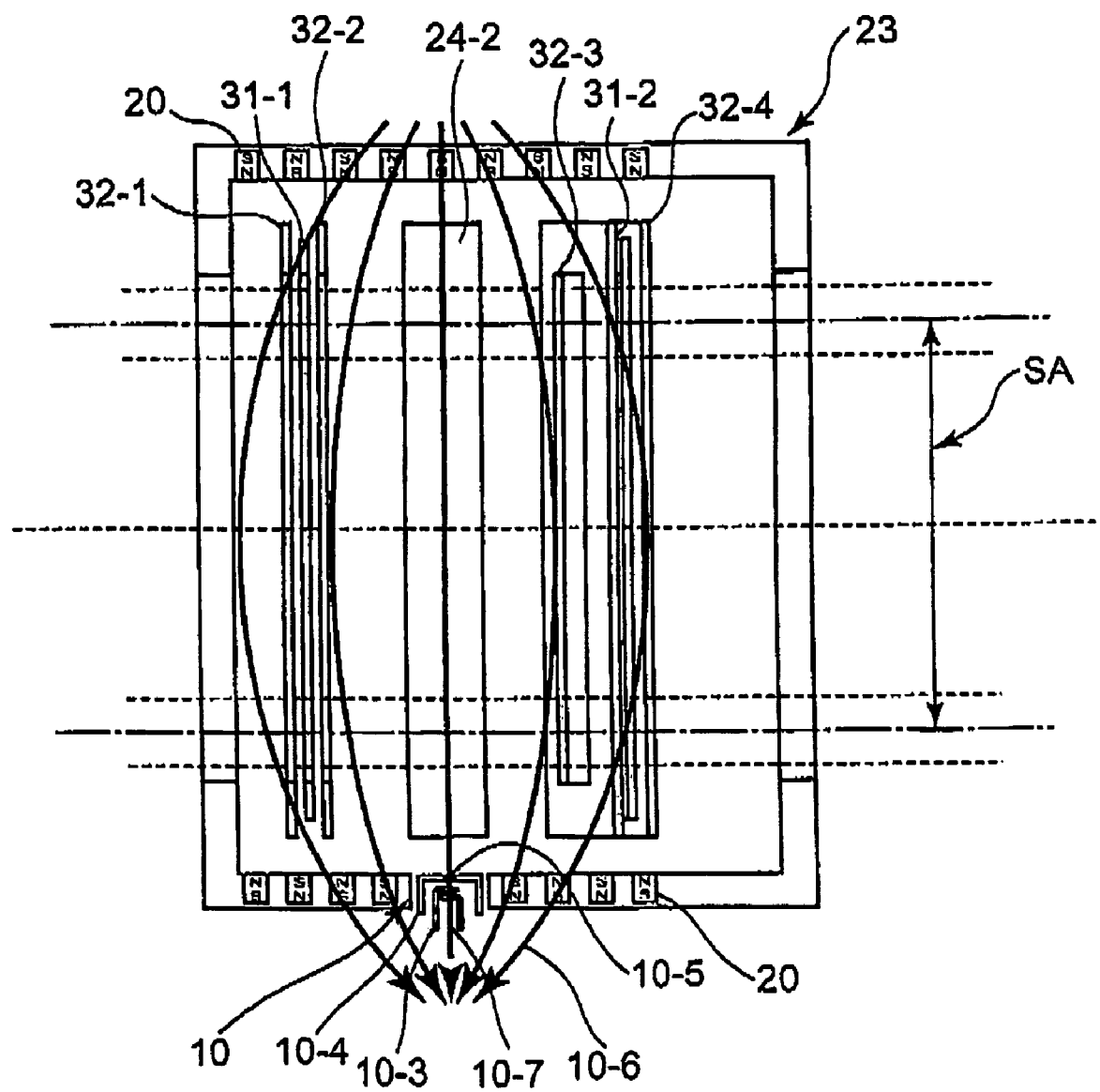
FIG. 8 is a cross-sectional view exemplarily showing a first embodiment wherein this invention is applied to the angular energy filter shown in FIG. 3.

Referring also to FIG. 8 given as an exemplary diagram observing from above an internal structure of the AEF chamber 23, description will be given about a first embodiment of a beam space-charge compensation device according to this invention.

As described before, the AEF chamber 23 includes therein the deflection electrodes 24-1 and 24-2 (illustration of the upper deflection electrode 24-1 being omitted in FIG. 8), the suppression electrodes 31-1 and 31-2, and the ground electrodes 32-1 to 32-4. The deflection electrodes are arranged at least in a pair on the upper and lower sides with respect to the beam advancing direction. The suppression electrodes and the ground electrodes are arranged on the upstream and downstream sides with respect to the beam advancing direction.

In this embodiment, a plasma shower 10 is further provided in the AEF chamber 23 and one feature of this embodiment resides in that the plasma shower 10 is arranged in the following manner. The plasma shower 10 is disposed at a position defined between the deflection electrodes 24-1 and 24-2 and between the upstream suppression electrode 31-1 and ground electrodes 32-1 and 32-2 and the downstream suppression electrode 31-2 and ground electrodes 32-3 and 32-4. Particularly, in the plasma shower 10, a center axis of a filament 10-3 and a center axis of an extraction hole 10-5 of an arc chamber 10-4 coincide with each other. Further, these axes are located at a position 10-7 that coincides with a line of magnetic force, being perpendicular to the beam advancing direction, among lines of magnetic force of an AEF magnetic field 10-6 directed toward the plasma shower 10. On the other hand, if the center axis of the extraction hole 10-5 of the arc chamber 10-4 does not coincide with the line of magnetic force, being perpendicular to the beam advancing direction, of the AEF magnetic field 10-6, the extraction efficiency of electrons decreases. Note that the arc chamber 10-4 is provided with one or more extraction holes. Further, as clear from FIG. 3, the plasma shower 10 is preferably disposed at a position corresponding to the vicinity of the beam deflection point caused by the AEF 17.

Moreover, the beam space-charge compensation device according to this embodiment has been improved in the following manner for enhancing the efficiency of confining electrons in the AEF chamber 23. As partly shown by arrows in FIG. 8, a plurality of permanent magnets 20 for forming confinement magnetic fields are disposed in inner walls (left right, upper, and lower surfaces parallel to the beam advancing direction) of the AEF chamber 23. In order to form the confinement magnetic fields, the permanent magnets 20 are disposed with their magnetic poles directed toward the inside of the AEF chamber 23 and with the magnetic poles of the adjacent permanent magnets 20 being opposite to each other. As shown in FIG. 4, the permanent magnets 20 disposed on each of the upper and lower inner walls of the AEF chamber 23 are arranged at intervals therebetween in the beam advancing direction and each extend in a lateral direction (leftward/rightward direction) perpendicular to the beam advancing direction. On the other hand, as shown in FIG. 8, the permanent magnets 20 disposed on each of the left and right inner walls of the AEF chamber 23 are arranged at intervals therebetween in the beam advancing direction so as to follow the deflected beam and each extend in an upward/downward direction. However, these permanent magnets 20 may be omitted.

Further, as clear from FIG. 8, the inside of the AEF chamber 23 is partitioned on its upstream and downstream sides with respect to the arc chamber 10-4 by the ground electrodes 32-1 to 32-4 (or the suppression electrodes 31-1 and 31-2) each having a required minimum opening. With this arrangement, the gas pressure in a plasma production region formed by the plasma shower 10 can be maintained relatively high while the AEF 17 is operated with a magnetic field being generated. In other words, the AEF chamber 23 also serves as a plasma shower chamber.

Figure 9:
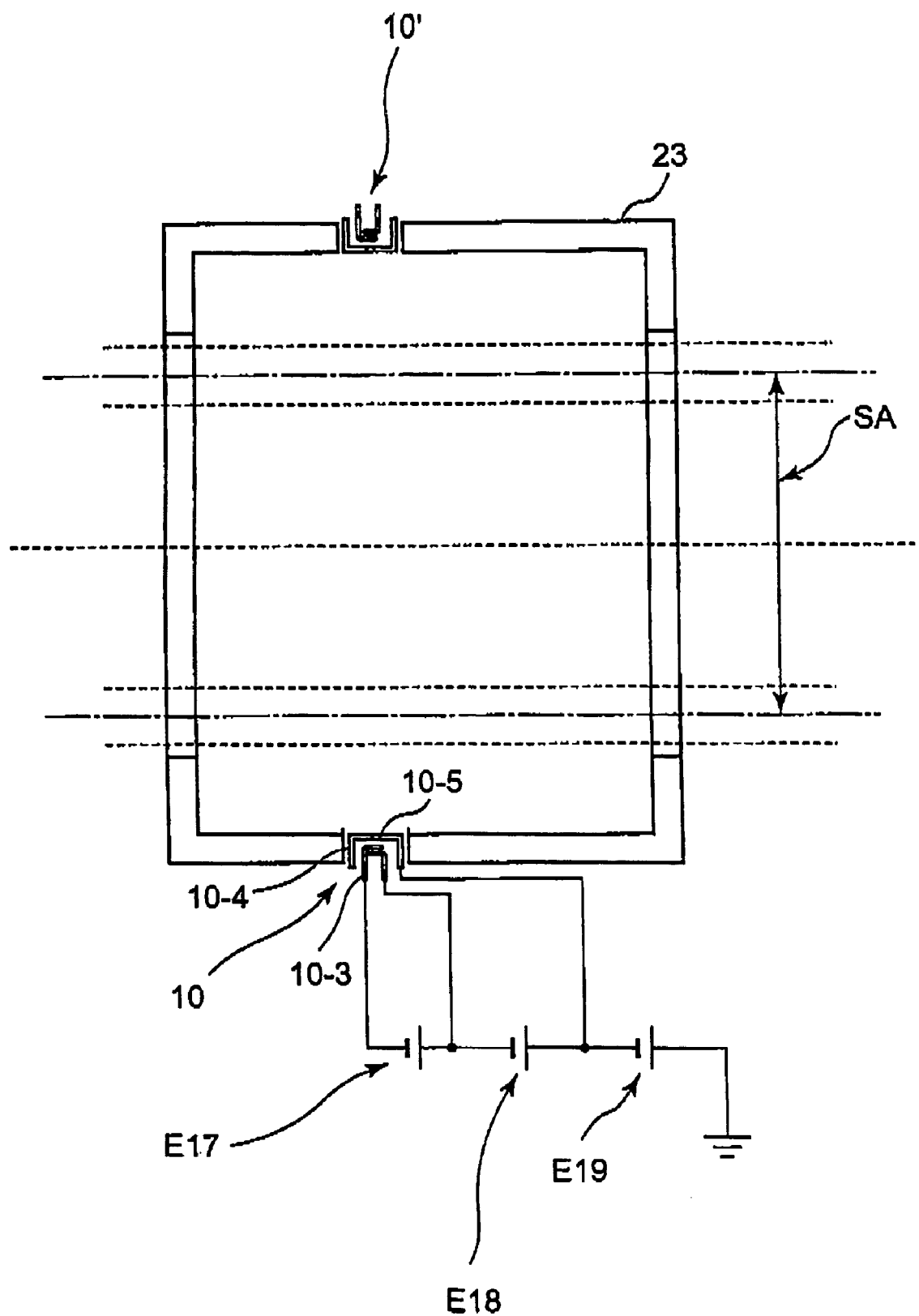
FIG. 9 is a cross-sectional view exemplarily showing a second embodiment of this invention that is different from the embodiment shown in FIG. 8.

FIG. 9 shows a beam space-charge compensation device according to a second embodiment of this invention. In the beam space-charge compensation device according to the second embodiment, another plasma shower 10' is provided in an AEF chamber 23 at a position on the side opposite to the side where the plasma shower 10 is located, wherein a scan area SA of the beam is interposed between the plasma showers 10 and 10'. FIGS. 3 and 4 described before show the example where this second embodiment is applied. Alternatively, a repeller electrode may be provided in place of the other plasma shower 10'. As is well known, the repeller electrode is an electrode for reflecting electrons. The repeller electrode may be disposed at the inner wall of the AEF chamber 23 in the insulating state or may be applied with a negative voltage. In FIG. 9, illustration of the AEF electrodes, the suppression electrodes, the ground electrodes, the permanent magnets for forming confinement magnetic fields, and so on is omitted.

Although illustration is omitted in FIG. 8 for brevity, a connection manner of power supplies with respect to the plasma shower 10 is the same as that shown in FIG. 9. Specifically, as shown in FIG. 9, a filament voltage is applied to the filament 10-3 from a filament power supply E17. A first arc voltage is applied across the filament 10-3 and the arc chamber 10-4 from a first arc power supply E18. Further, a power supply E19 is connected between the arc chamber 10-4 and ground for facilitating a supply of electrons to the beam side from the arc chamber 10-4. This connection manner is the same with respect to the other plasma shower 10'.

Figure 10:
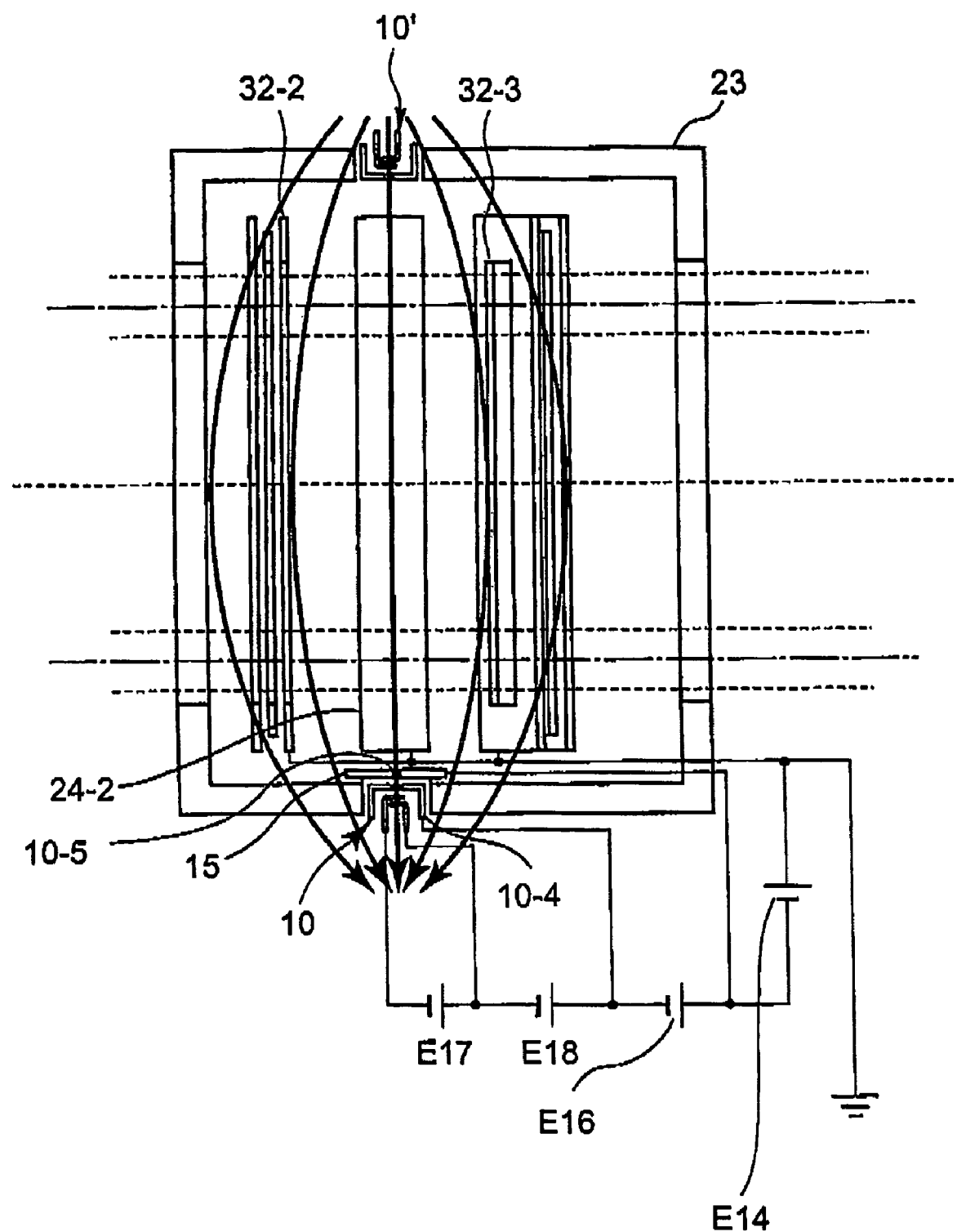
FIG. 10 is a cross-sectional view exemplarily showing a third embodiment of this invention that is different from the embodiment shown in FIG. 9.

FIG. 10 shows a beam space-charge compensation device according to a third embodiment of this invention. In this third embodiment, two changes are added to the second embodiment shown in FIG. 9. The first change is that a second arc voltage is newly applied from a second arc power supply E14 across the deflection electrodes 24-1 (see FIG. 3) and 24-2 and the ground electrodes 32-2 and 32-3, and the arc chamber 10-4 for improving the extraction efficiency of electrons from the arc chamber 10-4. In this first change, the deflection electrodes 24-1 and 24-2 and the ground electrodes 32-2 and 32-3 are connected to the positive side of the second arc power supply E14 and ground. As a modification of the first change, the deflection electrodes 24-1 and 24-2 and the ground electrodes 32-2 and 32-3 may be connected only to the negative side of the second arc power supply E14 so as to be applied with a negative voltage.

The second change is that an extraction electrode 15 having a hole corresponding to the extraction hole 10-5 is disposed near an outlet side of the extraction hole 10-5 in the plasma shower 10. An extraction voltage is applied across the arc chamber 10-4 and the extraction electrode 15 from an extraction power supply E16. This connection manner is the same with respect to the other plasma shower 10'. Naturally, the first and second changes may be individually applied to the second embodiment shown in FIG. 9. Also in FIG. 10, illustration of the permanent magnets 20 for forming confinement magnetic fields is omitted.

Figure 11:
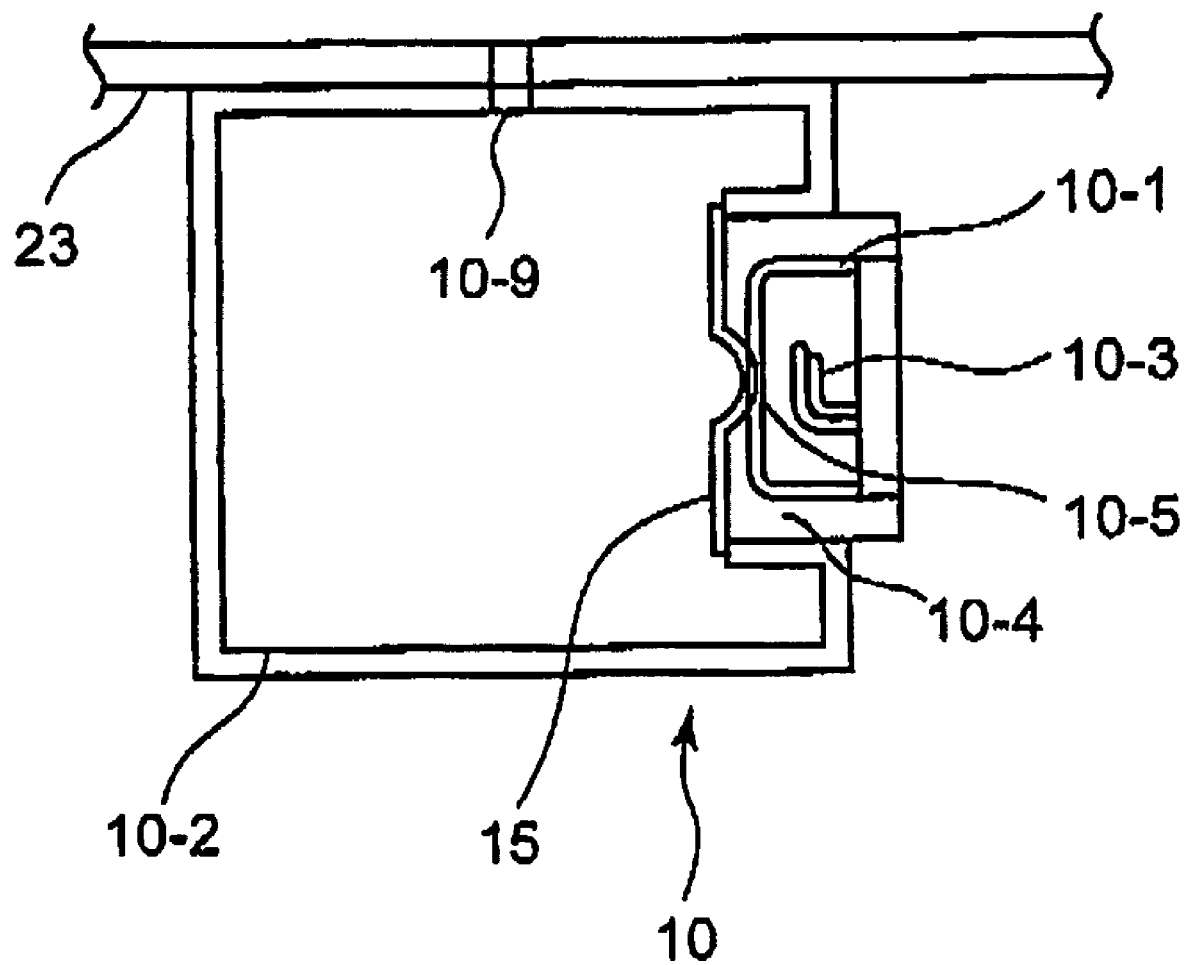
FIG. 11 is a cross-sectional view exemplarily showing a fourth embodiment of this invention with respect to only the vicinity of a plasma shower.

FIG. 11 shows a beam space-charge compensation device according to a fourth embodiment of this invention. In this fourth embodiment, a plasma shower 10 comprises a first arc chamber 10-1 (same as the arc chamber 10-4 in FIG. 8) and a second arc chamber 10-2. The first arc chamber 10-1 is provided with a filament 10-3, a gas introduction port (not illustrated), and one or more extraction holes 10-5. At a boundary portion between the first and second arc chambers 10-1 and 10-2, there is provided an extraction electrode 15 having a hole at a position corresponding to the extraction hole 10-5. A power supply connection manner with respect to the filament 10-3, the first arc chamber 10-1, and the extraction electrode 16 may be either of the connection manners described referring to FIGS. 9 and 10. On the other hand, it is preferable that an arc voltage be applied across the first and second arc chambers 10-1 and 10-2 for producing plasma in the second arc chamber 10-2. The second arc chamber 10-2 has a second extraction hole 10-9 directed toward the inside of the AEF chamber 23. Particularly, the second extraction hole 10-9 is arranged at the same position as that of the plasma shower 10 described referring to FIG. 8.

Now, description will be given about operation of the beam space-charge compensation device according to the first or second embodiment shown in FIG. 8 or 9.

A gas such as Ar is introduced into the arc chamber 10-4.

A current from the filament power supply E17 is supplied to the filament 10-3 disposed in the arc chamber 10-4 to heat the filament 10-3 to a high temperature to thereby generate thermo-electrons.

The thermo-electrons are accelerated by the first arc voltage applied across the filament 10-3 and the arc chamber 10-4 from the first arc power supply E18 to collide with the introduced gas, thereby producing plasma in the arc chamber 10-4.

When the beam passes near the extraction hole 10-5 of the arc chamber 10-4, electrons are extracted from the arc chamber 10-4 by the positive potential of the beam.

The extracted electrons collide with a neutral gas ejected from the extraction hole 10-5 without ionization in the arc chamber 10-4 so that plasma (plasma bridge) is formed between the extraction hole 10-5 and the beam.

The electrons in the arc chamber 10-4 are autonomously supplied to the beam through the plasma bridge to neutralize the positive charge of the beam.

The foregoing operation is the same as that of the conventional plasma shower.

In this invention, the plasma shower 10 is arranged such that the center axis of the filament 10-3 and the center axis of the extraction hole 10-5 coincide with the line of magnetic force, being perpendicular to the beam advancing direction, among the lines of magnetic force of the AEF magnetic field 10-6 (see FIG. 8) directed toward the plasma shower 10.

Electrons move so as to wind around a magnetic field. Therefore, the production of plasma in the arc chamber 10-4, the extraction of electrons from the plasma in the arc chamber 10-4, the formation of plasma bridge, and the confinement of plasma bridge are strengthened by the AEF magnetic field. When the beam is deflected by the deflector for scanning so that the distance between the beam and the extraction hole 10-5 of the arc chamber 10-4 increases, the amount of extracted electrons decreases. However, by disposing an arc chamber of the other plasma shower 10' so that the scan area SA of the beam is interposed between the arc chambers of the plasma showers 10 and 10' as shown in FIG. 9, as the distance between the beam and the arc chamber 10-4 on one side increases, the distance between the beam and the arc chamber on the other side decreases. As a result, it is possible to reduce the deflecting position dependency of the electron extraction amount. Further, the loss of electrons on the inner wall surfaces of the AEF chamber 23 is suppressed by the confinement magnetic fields formed at the inner walls of the AEF chamber 23.

Since the electrons are autonomously supplied from the plasma in the AEF chamber 23 to the ion beam entering the AEF chamber 23, the space-charge of the beam is neutralized (compensated) and therefore the divergence of the beam is suppressed.

Now, description will be given about operation of the third embodiment shown in FIG. 10.

The second arc voltage is applied from the second arc power supply E14 across the arc chamber 10-4, and the deflection electrodes 24-1 (see FIG. 3) and 24-2 and the ground electrodes 32-2 and 32-3 so that electrons are extracted from the arc chamber 10-4. Herein, the region surrounded by the upper and lower deflection electrodes 24-1 and 24-2 and the upstream and downstream ground electrodes 32-2 and 32-3 in the AEF chamber 23 for beam-guiding serves as a provisional arc chamber so that the electron amount can be increased. In this event, the AEF magnetic field is used as a source magnet. It is preferable not to use the deflection electrodes 24-1 and 24-2, the suppression electrodes 31-1 and 31-2, and the ground electrodes 32-1 to 32-4 for producing AEF and suppression electric fields when the plasma shower is used. This also applies to the embodiments shown in FIGS. 8 and 9.

In addition, since the extraction electrode 15 is disposed near the extraction hole 10-5 of the arc chamber 10-4 and the extraction voltage is applied across the extraction electrode 15 and the arc chamber 10-4 from the extraction power supply E16, the electron extraction efficiency is improved.

The electrons extracted into the AEF chamber 23 from the arc chamber 10-4 are accelerated by the second arc voltage and collide with a neutral gas ejected from the extraction hole 10-5 without ionization in the arc chamber 23. As a result, plasma is produced again in the AEF chamber 23.

The gas pressure in the plasma production region is maintained relatively high by the openings, each having the required minimum size, of the ground electrodes 32-2 and 32-3 located on the upstream and downstream sides in the AEF chamber 23 and, therefore, the plasma production efficiency is improved.

Electrons are autonomously supplied from the plasma in the AEF chamber 23 to the ion beam entering the AEF chamber 23. Accordingly, the space-charge of the ion beam is neutralized and therefore the divergence of the ion beam is suppressed.

Now, description will be given about operation of the fourth embodiment shown in FIG. 11.

A gas such as Ar is introduced into the first arc chamber 10-1 from the gas introduction port. A current is supplied from a filament power supply to the filament 10-3 disposed in the first arc chamber 10-1 to heat the filament 10-3 to a high temperature to thereby generate thermo-electrons. The thermo-electrons are accelerated by a first arc voltage applied across the filament 10-3 and the first arc chamber 10-1 from a first arc power supply. The accelerated thermo-electrons collide with the introduced gas so that plasma (consists of ions and electrons) is produced in the first arc chamber 10-1. The first arc chamber 10-1 is provided with one or more extraction holes 10-5 and the extraction electrode 15 is disposed on the outside thereof. By applying a first extraction voltage across the extraction electrode 15 and the first arc chamber 10-1 from a first extraction power supply, electrons in the generated plasma are extracted from the first arc chamber 10-1.

The second arc chamber 10-2 is introduced with a neutral gas ejected from the extraction hole 10-5 without ionization in the first arc chamber 10-1 and with the electrons extracted from the first arc chamber 10-1. Even if a material of the filament 10-3 should be scattered due to evaporation or the like, since the size of the extraction hole 10-5 is small, the scattered material stays within the first arc chamber 10-1 and thus is not introduced into the second arc chamber 10-2.

The electrons introduced into the second arc chamber 10-2 are accelerated by a second arc voltage applied across the second arc chamber 10-2 and the extraction electrode 15 from a second arc power supply. The accelerated electrons collide with the gas introduced from the first arc chamber 10-1 so that dense plasma is produced in the second arc chamber 10-2.

The second arc chamber 10-2 is provided with the second extraction hole 10-9 at the position corresponding to the ion beam passing region. The second arc chamber 10-2 is configured so as not to allow leakage of the gas from other than the second extraction hole 10-9, thereby preventing a reduction in gas pressure within the second arc chamber 10-2 to enhance the plasma production efficiency.

When the ion beam passes near the second extraction hole 10-9, the electrons are extracted from the second arc chamber 10-2 by the positive potential of the ion beam. The extracted electrons collide with a neutral gas ejected from the second extraction hole 10-9 without ionization in the first and second arc chambers 10-1 and 10-2. As a result, plasma (plasma bridge) is formed between the ion beam and the second arc chamber 10-2 (precisely the second extraction hole 10-9). The electrons in the second arc chamber 10-2 are autonomously supplied to the ion beam through the plasma bridge.

The second arc chamber 10-2 is configured so as to be applied with a second extraction voltage between itself and the ground potential from a second extraction power supply. With this configuration, it is possible to adjust the amount and energy of electrons supplied to the ion beam.

As described above, the plasma is efficiently supplied to the ion beam by the synergism of the plasma production based on the first arc chamber 10-1 and the plasma production based on the second arc chamber 10-2 so that the divergence of the ion beam can be suppressed more effectively.

Although the description has been given about the case where each embodiment of this invention is applied to the AEF that performs the beam deflection based on the electric field and the magnetic field, it is readily understood that this invention is also applicable to an AEF that performs beam deflection based on only a magnetic field. In this case, the deflection electrodes, the suppression electrodes, the ground electrodes, and so on shown in FIG. 3 are omitted. Further, in each of the foregoing embodiments, the description has been given about the example where the continuous cross-section of the beam is shaped into an ellipse or oval by scanning. However, this invention is also applicable when the scanning is not performed or when the cross-sectional shape of the beam is circular, elliptical, or oval.

According to this invention, by positively utilizing the AEF magnetic field for improving the production of plasma by the plasma shower, the extraction of electrons, and the confinement of electrons, it is possible to efficiently perform the beam space-charge compensation without using a particular magnetic field generating device or a particular magnetic field shielding device. With this arrangement, it is possible to suppress the divergence of the ion beam caused by the space-charge to improve the beam transportation efficiency to thereby increase the beam current.

While the present invention has thus far been described in connection with the preferred embodiments thereof, it will readily be possible for those skilled in the art to put this invention into practice in various other manners.

What is claimed is:

1. A beam space-charge compensation device which is applied to an angular energy filter provided midway in a beam path of an ion beam processing system that performs processing by irradiating onto a wafer with an ion beam, said angular energy filter selecting only an ion species having a necessary energy from the ion beam by the use of at least a magnetic field out of an electric field and the magnetic field, wherein the beam space-charge compensation device comprises a plasma shower provided in a beam-guiding chamber of said angular energy filter for beam space-charge compensation, said plasma shower comprises an arc chamber having therein a filament for generating thermo-electrons for plasma, said arc chamber comprises an extraction hole for extracting the thermo-electrons in the generated plasma, and said plasma shower is arranged such that said extraction hole is located on lines of magnetic force, perpendicular to an ion beam advancing direction, of said magnetic field and that a center axis of said filament and a center axis of said extraction hole coincide with the lines of magnetic force, perpendicular to the ion beam advancing direction, of said magnetic field.

2. A beam space-charge compensation device according to claim 1, wherein said plasma shower is provided on both inner-sides of the beam-guiding chamber of said angular energy filter with the ion beam interposed between said both inner-sides.

3. A beam space-charge compensation device according to claim 2, wherein the beam-guiding chamber of said angular energy filter also serves as a plasma shower chamber.

4. A beam space-charge compensation device according to claim 3, wherein, in order to form plasma confinement magnetic fields at upper, lower, left, and right inner walls, with respect to the ion beam, of the beam-guiding chamber of said angular energy filter, a plurality of magnets are disposed at each of said upper, lower, left, and right inner walls.

5. A beam space-charge compensation device according to claim 4, wherein the confinement magnetic fields at said left and right inner walls in the beam-guiding chamber of said angular energy filter are formed by disposing the plurality of magnets along the ion beam deflected by said angular energy filter.

6. A beam space-charge compensation device according to claim 4, wherein the confinement magnetic fields at said upper and lower inner walls in the beam-guiding chamber of said angular energy filter are formed by disposing the plurality of magnets at said upper and lower inner walls at intervals defined in the ion beam advancing direction, each of said plurality of magnets at said upper and lower inner walls extending in a leftward/rightward direction.

7. A beam space-charge compensation device according to claim 6, wherein said plasma shower is provided at a position corresponding to the vicinity of a deflection point of the ion beam caused by said angular energy filter.

8. A beam space-charge compensation device according to claim 7, wherein plasma is produced in the beam-guiding chamber of said angular energy filter where said magnetic field exists.

9. A beam space-charge compensation device according to claim 8, wherein said angular energy filter selects only the ion species having the necessary energy from the ion beam by the use of the magnetic field and the electric field and comprises, for producing the electric field, a pair of deflection electrodes arranged on upper and lower sides with respect to the ion beam and suppression electrodes and ground electrodes arranged on upstream and downstream sides with respect to the ion beam advancing direction, said plasma shower is disposed at a position defined between said pair of deflection electrodes and between said suppression and ground electrodes on said upstream side and said suppression and ground electrodes on said downstream side, and an arc voltage is applied across said arc chamber, and said pair of deflection electrodes and said ground electrodes while said angular energy filter is operated by said magnetic field.

10. A beam space-charge compensation device according to claim 9, wherein a plasma production region is formed by partitioning the inside of the beam-guiding chamber of said angular energy filter by the use of said ground electrodes arranged on the upstream and downstream sides of said plasma shower and each having a required minimum opening.

11. A beam space-charge compensation device according to claim 10, wherein said plasma shower, said pair of deflection electrodes, said suppression and ground electrodes on said upstream side, and said suppression and ground electrodes on said downstream side are connected as one unit, and configured so as to be integrally attachable and detachable with respect to the beam-guiding chamber of said angular energy filter.

12. An ion implantation system comprising the beam space-charge compensation device according to any one of claims 1 to 11.

* * * * *